(12) United States Patent
Akima et al.

(10) Patent No.: US 9,312,094 B2
(45) Date of Patent: Apr. 12, 2016

(54) CHARGED PARTICLE BEAM DEVICE

(75) Inventors: Hisanao Akima, Tokyo (JP); Yoichi Hirayama, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/235,076

(22) PCT Filed: Jul. 9, 2012

(86) PCT No.: PCT/JP2012/067440
§ 371 (c)(1),
(2), (4) Date: May 4, 2014

(87) PCT Pub. No.: WO2013/015102
PCT Pub. Date: Jan. 31, 2013

(65) Prior Publication Data
US 2014/0231666 A1 Aug. 21, 2014

(30) Foreign Application Priority Data
Jul. 26, 2011 (JP) .................................. 2011-163528

(51) Int. Cl.
*H01J 37/00* (2006.01)
*H01J 37/153* (2006.01)
*H01J 37/30* (2006.01)

(52) U.S. Cl.
CPC ........... *H01J 37/153* (2013.01); *H01J 37/3007* (2013.01)

(58) Field of Classification Search
USPC .................................................... 250/396 R
See application file for complete search history.

(56) References Cited

U.S. PATENT DOCUMENTS

| 4,130,867 | A  | * | 12/1978 | Bachman et al. |
| 6,552,340 | B1 | * | 4/2003  | Krivanek ............... H01J 37/153 250/305 |
| 6,605,810 | B1 |   | 8/2003  | Haider et al. |
| 6,646,267 | B1 |   | 11/2003 | Haider et al. |
| 7,283,435 | B2 | * | 10/2007 | Kuze .................. G11B 7/08511 369/44.23 |
| 7,838,858 | B2 | * | 11/2010 | Okita .................... G03F 9/7003 250/221 |

(Continued)

FOREIGN PATENT DOCUMENTS

| JP | 2002-510431 A | 4/2002 |
| JP | 2006-114304 A | 4/2006 |

(Continued)

OTHER PUBLICATIONS

P. Hawkes, "Advances in IMAGING and ELECTRON PHYSICS vol. 153 Aberration-corrected Electron microscopy", Academic Press, p. 63 (2008).

*Primary Examiner* — Phillip A Johnston
(74) *Attorney, Agent, or Firm* — Miles & Stockbridge P.C.

(57) ABSTRACT

This charged particle beam device comprises: an electron beam source (1); a charged particle optical system that includes an object lens (9) and that irradiates a sample (10) with electrons emitted from the electron beam source (1) as an electron beam (2); an aberration corrector (6) that corrects aberrations in the charged particle optical system; and a control unit (24) that controls the components of the charged particle optical system and the aberration corrector (6). The charged particle beam device further comprises an automatic aberration-correcting device (17) that autonomously acquires, through leaning, optimum adjustment procedures in order to reduce the time required for correcting parasitic aberrations that arise in the aberration corrector (6).

9 Claims, 15 Drawing Sheets

(56) References Cited

U.S. PATENT DOCUMENTS 8,031,565 B2 * 10/2011 Isshiki .................. G11B 7/005
369/44.27
2007/0120055 A1    5/2007  Sawada et al.

FOREIGN PATENT DOCUMENTS

| JP | 2007-180013 A | 7/2007 |
| JP | 2007-266008 A | 10/2007 |
| JP | 2010-218591 A | 9/2010 |

* cited by examiner

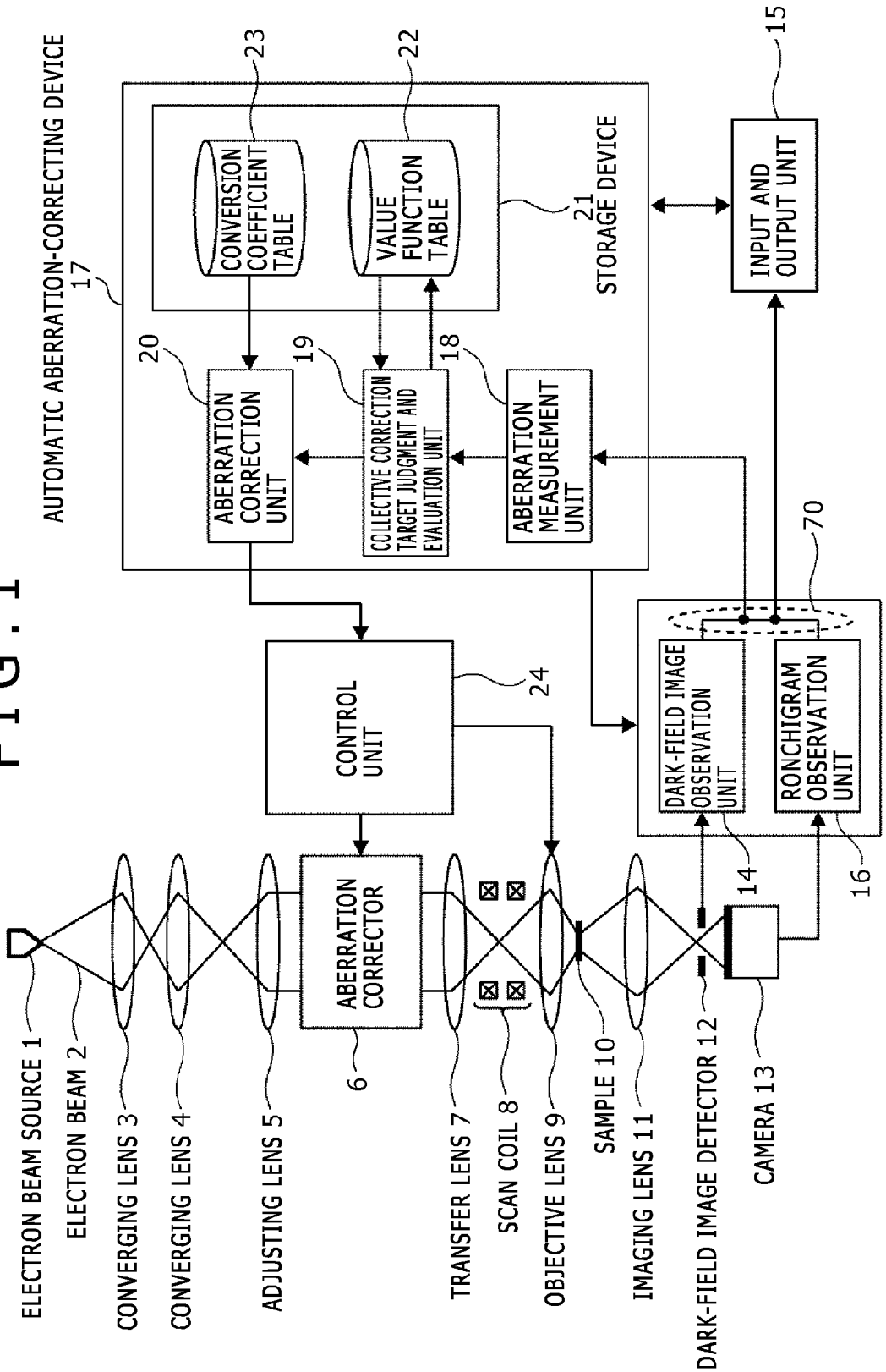

EVALUATION PHASE

ATTEMPT PHASE

FIG. 3

| | | | | | | | |
|---|---|---|---|---|---|---|---|
| $S_1$ | $Q_{A1\text{-}1}$ | $Q_{B2\text{-}1}$ | $Q_{A2\text{-}1}$ | $Q_{C3\text{-}1}$ | $Q_{S3\text{-}1}$ | $Q_{A3\text{-}1}$ | |
| $S_2$ | $Q_{A1\text{-}2}$ | $Q_{B2\text{-}2}$ | $Q_{A2\text{-}2}$ | $Q_{C3\text{-}2}$ | $Q_{S3\text{-}2}$ | $Q_{A3\text{-}2}$ | 22 |
| ... | ... | ... | ... | ... | ... | ... | |
| $S_{15625}$ | $Q_{A1\text{-}15625}$ | $Q_{B2\text{-}15625}$ | $Q_{A2\text{-}15625}$ | $Q_{C3\text{-}15625}$ | $Q_{S3\text{-}15625}$ | $Q_{A3\text{-}15625}$ | |

FIG.5

[INPUT] AGGREGATION OF ABERRATION COEFFICIENTS $C_t = \{A_{1t}, B_{2t}, A_{2t}, C_{3t}, S_{3t}, A_{3t}\}$

S2-1 — TAKE ABSOLUTE VALUES OF ABERRATION COEFFICIENTS

S2-2 — STANDARDIZE THEM WITH CORRECTION TARGET VALUES

S2-3 — EVALUATE STANDARDIZED VALUES ACCORDING TO FIVE (0 TO 4) LEVELS

S2-4 — ALIGN VALUES SUBJECTED TO FIVE-LEVEL EVALUATION TO OBTAIN QUINARY NUMBER IN SIX DIGITS

S2-5 — PERFORM CONVERSION FROM QUINARY NUMBER INTO DECIMAL NUMBER

[OUTPUT] DECIMAL NUMERICAL VALUE $S_t$ INDICATING ABERRATION STATUS

FIG.6

|  | A1/nm | B2/nm | A2/nm | C3/μm | S3/μm | A3/μm |
|---|---|---|---|---|---|---|
| 78pm@200kV | 1.121 | 18.85 | 56.55 | 2.344 | 0.586 | 2.344 |
| 138pm@80kV | 2.279 | 37.65 | 113 | 4.975 | 1.244 | 4.975 |

|   | A1 | B2 | A2 | C3 | S3 | A3 |
|---|----|----|----|----|----|----|
| 0 | ≤1 | ≤1 | ≤1 | ≤1 | ≤1 | ≤1 |
| 1 | 1~10 | 1~10 | 1~10 | 1~5 | 1~5 | 1~5 |
| 2 | 10~20 | 10~20 | 10~20 | 5~10 | 5~10 | 5~10 |
| 3 | 20~30 | 20~30 | 20~30 | 10~15 | 10~15 | 10~15 |
| 4 | 30≤ | 30≤ | 30≤ | 15≤ | 15≤ | 15≤ |

RECORDING PHASE

RECOVERY PHASE

CHARGED PARTICLE BEAM DEVICE

TECHNICAL FIELD OF INVENTION

The present invention relates to a charged particle beam device, and more specifically to a charged particle beam device provided with an automatic spherical aberration correction device.

BACKGROUND ART

Some recent charged particle beam devices, such as a transmission electron microscope (TEM) and a scanning transmission electron microscope (STEM) include a spherical aberration correction device (hereinafter referred to as an aberration corrector). This aberration corrector is used for correcting a spherical aberration (Cs) of an objective lens which is a main factor limiting resolution in the TEM and the STEM. Known as the aberration corrector is the one which has two multi-pole lenses generating a six-pole field and two axisymmetrical lenses (transmitting lenses) arranged therebetween (for example, see Patent Literature 1).

The Cs of the objective lens is corrected by the aberration corrector. However, due to incompleteness of the aberration corrector, that is, for example, a position aberration of individual poles forming the multi-pole lens and magnetic property variation of a pole material, unnecessary aberrations called parasitic aberrations occur. The occurring third or lower parasitic aberrations include: a two-fold symmetric primary astigmatism (A1), a one-fold symmetric secondary coma aberration (B2), a three-fold symmetric secondary astigmatism (A2), a two-fold symmetric third star aberration (S3), and a four-fold symmetric third astigmatism (A3). In adjustment of the aberration corrector, correction of these parasitic aberrations in addition to the Cs is necessary.

To an aberration corrector of a product, an alignment tool for correcting the Cs and the parasitic aberrations are attached, and an adjustment staff member can use the alignment tool to semi-automatically perform adjustment of the aberration corrector (for example, see Non-Patent Literature 1). Arranged on GUI (graphical user interface) of the alignment tool are: an aberration measurement button, and aberration correction buttons respectively corresponding to a plurality of aberrations. As a result of pressing the aberration measurement button, an aberration coefficient representing magnitude of each aberration remaining in the optical system is measured based on a plurality of obtained electroscopic images (for example, see Patent Literature 2 for an aberration measurement method). As a result of pressing the aberration correction button, a feedback acts on the aberration corrector in accordance with the measured aberration coefficient, and the specified aberration is corrected (for example, see Patent Literatures 3 and 4 for an aberration correction method).

The aberration measurement and correction are automatically performed by the use of the alignment tool, but judgment on which aberration is to be preferentially corrected based on a result of the aberration measurement is left up to the adjustment staff member. Normally, the adjustment staff member corrects the aberrations preferentially starting with the aberration with the largest aberration coefficient, and the correction is repeated until all the third or lower aberrations become equal to or smaller than a permitted value.

Disclosed in a field of an optical disc device is a method of learning an optimum control amount for aberration correction (recording an optimum status found through searching) (see Patent Literature 5).

PRIOR ART LITERATURES

Patent Literatures

[Patent Literature 1] Japanese Translation of PCT International Application Publication No. 2002-510431
[Patent Literature 2] Japanese Patent Application Laid-open No. 2007-180013
[Patent Literature 3] Japanese Patent Application Laid-open No. 2007-266008
[Patent Literature 4] Japanese Patent Application Laid-open No. 2006-114304
[Patent Literature 5] Japanese Patent Application Laid-open No. 2010-218591

Non-Patent Literature

[Non-Patent Literature 1] P. Hawkes, "Advances in IMAGING and ELECTRON PHYSICS Vol. 153 Aberration-corrected Electron microscopy", Academic Press, p. 63 (2008)

SUMMARY OF THE INVENTION

Problem to be Solved by the Invention

As described above, the adjustment of the aberration corrector is semi-automatically performed by the use of the alignment tool, but time required for the adjustment varies depending on judgment of the aberration to be corrected.

What is difficult here is judgment on which aberration is to be corrected. The aberration coefficients obtained by the aberration measurement inevitably have an error, and the relatively smaller aberration tend to have a larger measurement error. For example, in a case where the given aberration is dominantly large, the measurement errors of the other smaller aberrations become larger, and performing correction based on the aberration coefficient with the large measurement error may result in an increase in aberrations. Moreover, some aberration corrections are independent from each other but some aberration corrections interfere with each other, and correcting one of the aberrations may result in an increase in the other. In particular, correction of the third aberration tends to increase the secondary or lower aberrations.

Thus, realized in prior art is only automatic adjustment based on a relatively simple rule such that only one with the largest aberration coefficient is selected and it is preferentially corrected (for example, see Patent Literature 4).

Moreover, it is difficult to apply a technology described in Patent Literature 5 to a charged particle beam device. This is because an electromagnetic lens has hysteresis property and thus recovering a status of the electromagnetic lens to its previous optimum status after largely changing the status of the electromagnetic lens, for example, by turning off a power source of the device, does not cause a return to an original optimum status.

It is assumed that correcting not only the aberration with the largest aberration coefficient but also the aberrations with the second and third largest aberration coefficients at a time can reduce the number of times of aberration measurement in the charged particle beam device. Typically, it is required to acquire a plurality of electron microscopic images for one trial of the aberration measurement, and it takes approximately one minute for the measurement. However, in feedback to the aberration corrector for aberration correction, only approximately one second or below is required. Thus, it is assumed that capability of simultaneously correcting a plurality of aberrations in one trial of aberration measurement can reduce the number of times of aberration measurement, and thus is greatly effective for shortening adjustment time.

A skilled adjustment staff member can make judgment to perform correction of a plurality of aberrations at a time depending on his/her experiences while considering magnitude and a ratio of each aberration coefficient and which aberration coefficient is dominant. Previously programming these experiences is assumed to permit realization of an alignment tool which automatically makes judgment of such correction that shortens adjustment time. However, it is not realistic to previously describe optimum correction judgment for an endless number of combinations of magnitudes and kinds of aberration coefficients. In particular, charged particle beam devices, not only when they have different specifications but also when they have the same specifications, have their respective specific factors, for example, individual differences such as pole misalignment attributable to an fabrication error and magnetic property variation and a difference in device install environment (hereinafter, individual difference), and automatically making judgment of optimum correction for each charged particle beam device reflecting all these individual differences has not yet been put into practice.

As described above, in the prior art, the aberration measurement and correction have been automated, but judgment on what correction is to be performed for reducing the number of times of aberration measurement and shortening adjustment time has not yet been automated.

It is an object of the present invention to provide an automatic aberration-correcting device capable of acquiring, by learning, optimum adjustment procedures for automatically making judgment of correction for a plurality of aberrations and shortening adjustment time.

Means for Solving the Problem

To address the aforementioned problem, in the present invention, a charged particle beam device is characterized by including: a charged particle beam source; a charged particle optical system irradiating a sample with a charged particle emitted from the charged particle beam source as a charged particle beam; an aberration corrector correcting an aberration of the charged particle optical system; and a control unit controlling various components of the charged particle optical system and the aberration corrector, wherein the charged particle beam device further comprises: an automatic aberration-correcting device autonomously acquiring optimum adjustment procedures by learning.

Effect of the Invention

According to the present invention, a plurality of times of aberration correction, which were effective in past adjustment for each aberration measurement, are simultaneously carried out, thus making it possible to perform automatic aberration correction in short adjustment time.

BRIEF DESCRIPTION OF THE DRAWINGS

FIG. 1 is a diagram showing a system configuration example of a charged particle beam device according to a first embodiment of the present invention.

FIG. 3 is a diagram showing a structure example of the value function table.

FIG. 5 is a flowchart showing procedures of digitizing an aberration status by a status function.

FIG. 6 is a diagram showing an example of correction target values.

BEST MODE FOR CARRYING OUT THE INVENTION

Figure 2B:
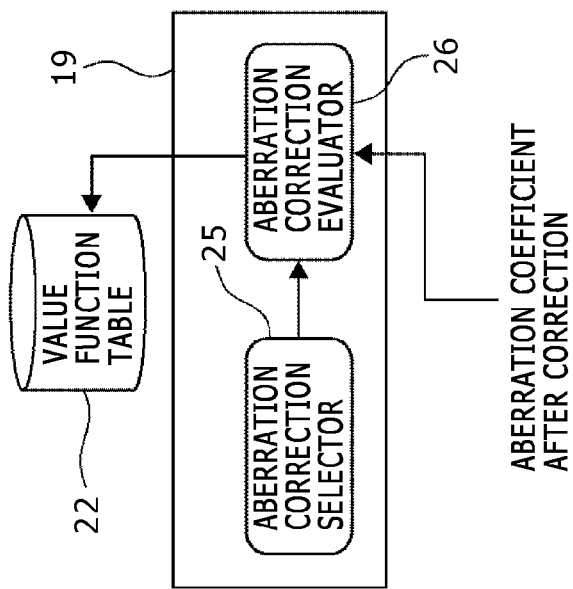
FIG. 2 is a diagram showing interaction between a collective correction target judgment and evaluation unit and a value function table realizing a learning function according to the first embodiment.

A charged particle beam device of the present invention includes: a charged particle beam source; a charged particle optical system irradiating a sample with a charged particle emitted from the charged particle beam source as a charged particle beam; an aberration corrector correcting an aberration of the charged particle optical system; and a control unit controlling various components of the charged particle optical system and the aberration corrector, and further has an automatic aberration corrector acquiring optimum adjustment procedures for a plurality of aberrations by learning.

In a representative embodiment of the invention, prepared is a table (a value function table) describing effect (values) expected when each aberration is corrected for each aberration coefficient combination. The value function table is a table digitizing which aberration is to be preferentially corrected for a given aberration status. Then in accordance with an aberration correction selection probability calculated based on the value function table, correction of a plurality of aberrations at a time is attempted. Specifically, the automatic aberration-correcting device can collectively perform correction of a plurality of aberrations and collectively perform evaluation thereof. However, it is needless to say that depending on a measured aberration status, one aberration is targeted at a time. Effect of each correction is quantified as a reward, and the value function table is updated by a reinforcement learning method. The correction with the greater reward (the one whose aberration has decreased as a result of the correction) has a higher value, and a selection probability in the next correction increases. On the contrary, a value of the correction with the negative reward (the one whose aberration has increased as a result of the correction) decreases, and its selection probability decreases. As described above, an attempt to perform simultaneous correction of a plurality of aberrations and evaluation of their correction effect are repeated until each aberration becomes a value equal to or smaller than a target value (with which target resolution is obtained). As adjustment is repeated, the value function table is more optimized, permitting judgment of aberration correction utilizing past adjustment experiences. In other words, the value function table obtained as a result of the reinforcement learning is a table giving, as a numerical value, optimum adjustment procedures for each aberration in a given aberration status.

A plurality of times of aberration correction which were effective in the past adjustment for each aberration measurement are simultaneously carried out, thus making it possible to perform automatic aberration correction in short adjustment time.

Moreover, the automatic aberration-correcting device autonomously acquires, by learning, the optimum adjustment procedures with which the plurality of times of aberration correction can be simultaneously carried out, and thus even a user who is not a skilled adjustment staff member can perform appropriate aberration correction.

As described above, acquiring, by the reinforcement learning, the optimum adjustment procedures with which the plurality of times of aberration correction can be simultaneously carried out makes it possible to perform automatic aberration correction, which reflects a situation specific to the individual charged particle beam device, in short adjustment time.

Hereinafter, embodiments of the present invention will be described in detail based on the drawings.

First Embodiment

An example of a charged particle beam device according to the first embodiment of the invention will be described with reference to FIGS. 1 to 13.

FIG. 1 is a diagram showing an overall system configuration example of the charged particle beam device according to the first embodiment. In FIG. 1, a scanning transmission electron microscope (STEM) will be described as an example of the charged particle beam device. The charged particle beam device includes: an electron beam source 1 (charged particle beam source); a charged particle optical system irradiating a sample 10 with a charged particle emitted from the charged particle beam source as a charged particle beam; an aberration corrector 6 correcting an aberration of the charged particle optical system; a control unit 24 controlling various components of the charged particle optical system and the aberration corrector; and an automatic aberration-correcting device 17.

The electron beam 2 emitted from the electron beam source 1 links a focal point to a physical surface of an adjustment lens 5 by receiving action of converging lenses 3 and 4, and parallelly enters into the aberration corrector 6 by action of the adjustment lens 5.

In the aberration corrector 6, each aberration of the electron beam 2 is corrected, and a focal point is linked to an upside of an objective lens 9 by action of a transfer lens 7. The aberration corrector 6 includes, for example, a multi-pole, six-pole lens and a transmission lens, and each of aberrations Cs, A1, B2, A2, C3, S3, and A3 is automatically corrected.

The electron beam 2 whose aberration has been corrected is converged by the objective lens 9, forming a micro probe on the sample 10. The probe on the sample 10 is scanned by a scan coil 8, and a scattering wave exiting from the sample 10 is received by a dark-field image detector 12, and intensity of this scattering wave is displayed as a bright point sequence on an image display part of an input and output unit 15 by a dark-field image observation unit 14 in synchronization with the probe scanning, thereby obtaining a dark-field image of the sample 10. Upon Ronchigram observation, the electron beam scanning by the scan coil 8 is stopped, a transmitted and scattering wave exiting from the sample 10 is received by a camera 13, and two-dimensional distribution of intensities of the transmitted and scattering wave is displayed as a bright point sequence on the image display unit part of the input and output unit 15 by a Ronchigram observation unit 16. An imaging lens 11 adjusts widening of the electron beam entering into the dark-field image detector 12 and the camera 13. The dark-field image observation unit 14 and the Ronchigram observation unit 16 are mutually connected to the input and output unit 15 and the automatic aberration-correcting device 17. Based on a measurement method of the automatic aberration-correcting device 17, output of either of the dark-field image observation unit 14 and the Ronchigram observation unit 16 is selected by a switch function 70 (see FIG. 2). Moreover, when necessary, the input and output unit 15 may be provided with a screen display part including a plurality of screens with a GUI function, and a button, an image, or the like on each screen may be selected whereby the user performs various input operations for the charged particle beam device and acquire output information.

The automatic aberration-correcting device 17 is composed of: an aberration measurement unit 18, a collective correction target judgment and evaluation unit 19, and an aberration correction unit 20. The aberration measurement unit 18 measures an aberration coefficient by using a dark-field image outputted from the dark-field image observation unit 14 or Ronchigram outputted from the Ronchigram observation unit 16. The collective correction target judgment and evaluation unit 19 collectively selects one or a plurality of aberrations to be corrected based on the aberration coefficient measured by the aberration measurement unit 18 and the value function table 22 saved in a storage device 21, and gives instructions to the aberration correction unit 20 for correction. The aberration correction unit 20, for each aberration coefficient for which the instructions for collective correction has been given, refers to a conversion coefficient table 23 saved in the storage device 21 to thereby calculate each control amount, such as current and voltage, required for the correction based on each aberration coefficient (the conversion coefficient table is previously calibrated), and outputs each control signal to the control unit 24. Based on this each control signal, the control unit 24 gives a feedback to the aberration corrector 6 and the objective lens 9 whereby each aberration is corrected. Effect of the aberration correction is evaluated by the collective correction target judgment and evaluation unit 19, and results of this learning are reflected on the value function table 22. The automatic aberration-correcting device 17 is implemented by, for example, a program executed on a computer to realize functions of the aberration measurement unit, the collective correction target judgment and evaluation unit, and the aberration correction unit.

The automatic aberration-correcting device 17 according to the invention has a function of simultaneously carrying out a plurality of times of aberration corrections and leaning them. This automatic aberration correction learning function is mainly realized by the collective correction target judgment and evaluation unit 19 and the value function table 22. The collective correction target judgment and evaluation unit 19 can collectively correct and collectively evaluate a plurality of aberrations. This collective correction target judgment and evaluation unit 19 has an aberration correction selector 25 and an aberration correction evaluator 26 (see FIG. 2). The aberration correction selector 25 selects a plurality of or one aberration to be collectively corrected and gives instructions to the aberration correction unit 20 for correction. In the aberration correction evaluator 26, effect of each aberration correction after the correction is quantified as a reward, and based on this reward, the value function table 22 is updated. Such autonomous learning can be collectively performed for a plurality of aberrations. Use of the adjustment procedures based on this value function table 22 makes it possible to perform automatic aberration correction, which reflects the individual difference of the charged particle beam device, in short adjustment time.

Figure 2A:
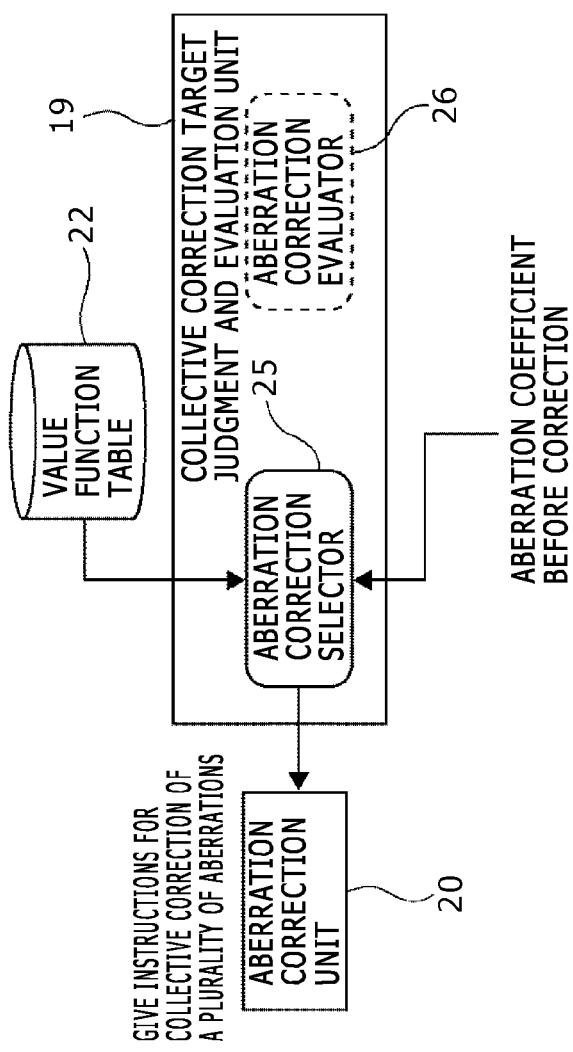

FIG. 2 shows interaction between the collective correction target judgment and evaluation unit 19 and the value function table 22 before and after correction at a given time point, where a phase before the correction is called an attempt phase and a phase after the correction is called an evaluation phase. In the attempt phase (FIG. 2A), based on each aberration coefficient before the correction measured by the aberration measurement unit 18 and the value function table 22, the aberration correction selector 25 selects a plurality of aberrations to be collectively corrected, and gives instructions to the aberration correction unit 20 for collective correction. Here, the aberration correction selector 25 holds a kind of each selected aberration and its aberration coefficient. In the evaluation phase (FIG. 2B), based on each aberration coefficient after the collective correction measured by the aberration measurement unit 18, the kind of each selected aberrations held by the aberration correction selector 25, and its aberration coefficient, the aberration correction evaluator 26 evaluates effect of the collective correction and updates the value function table 22. Repeating these attempt phase and evaluation phase optimizes the value function table 22, improving accuracy of judgment by the collective correction target judgment and evaluation unit 19.

Here, details of the value function table 22 will be described. FIG. 3 is a diagram showing a structure of the value function table 22. The value function table is a table digitizing which aberration is to be preferentially corrected for given aberration statuses. The value function table 22 is obtained by: classifying, into N-number of levels, values obtained by standardizing the aberration coefficients with their respective correction target values; converting a numerical value obtained in an N-th order number as a result of arraying the classified values into the one in a decimal number; and providing, as an aberration status, a numerical value obtained as a result of the aforementioned conversion; and providing this aberration status as a column index. It is desirable that N be approximately 4 to 8. Described in the example of FIG. 3 are aberration statuses $s_1$ to $s_{15625}$ for 15625 columns corresponding to $5^6$ obtained by classifying, into five levels, values obtained by standardizing the six aberration coefficients (A1, B2, A2, C3, S3, A3) with their respective correction target values.

The update (learning) of the value function table 22 is performed based on a reward r(s, a) which is calculated in the evaluation phase described in FIG. 2B and which quantifies effect when specific correction a is performed from the given aberration status s. The value function table 22 provides, as a column index, the aberration status digitizing a combination of aberration coefficients, and written on the $s_i$-th column are estimated reward values (called values Q) $Q_{A1-i}$, $Q_{B2-i}$, $Q_{A2-i}$, $Q_{C3-i}$, $Q_{S3-i}$, $Q_{A3-i}$ obtained by correcting A1, B2, A2, C3, S3, and A3 in the aberration status $s_i$.

There are two possible ways of setting initial values of the value function table 22, i.e., setting those assumed to be close to true values of the rewards and setting completely random values. The former is a method of defining experiences of a skilled staff member as initial values of the value function table and improving them by learning, and the latter is a method of optimizing the value function table through try and error when the concerned staff member has no experience. A possible method for determining initial values of the value function table in the former is setting a high value for the relatively large aberration since correction with a smaller error should be performed in the given aberration status, and making settings to provide a high value for the correction performed in a state in which a sum of the aberration coefficients is small between the different aberration statuses since it reaches a target correction status with higher possibility.

Hereinafter, based on a flowchart shown in FIG. 4, the automatic aberration correction process with a learning function according to the invention (hereinafter, automatic correction process) will be described. The automatic correction process is mainly divided into the attempt phase (S1 to S4 of FIG. 4) described in FIG. 2A and the evaluation phase (S5 to S9 of FIG. 4) described in FIG. 2B. In the attempt phase, the current aberration coefficients are measured by the aberration measurement unit 18 (S1), the aberration status is identified from the aberration coefficients by a status function (S2), a plurality of aberrations to be corrected based on the value function table 22 by a policy function are stochastically selected (S3), and the selected aberrations are corrected by the aberration correction unit 20 (S4). In the evaluation phase, the aberration coefficients after the correction are measured by the aberration measurement unit 18 (S5), the aberration status after the correction is identified (S7), and effect of the correction is quantified as a reward by a reward function (S8). Then the value function table is updated by Q learning based on the reward, whereby learning results are reflected on the value function table 22 (S9). In the middle of the evaluation phase, it is checked whether or not each aberration is equal to or smaller than the correction target value (S6), and if yes, a sequence of aberration correction, that is, aberration adjustment ends. By repeating the adjustment until each aberration becomes equal to or smaller than the target value, an optimized value function table specific to the charged particle beam device is obtained. On the other hand, if the check result is No, the aberration coefficients and the aberration status before the correction are respectively replaced with the aberration coefficients and the aberration status after the correction (S10). After end of one sequence of aberration correction, the process returns to S3 in the attempt phase, and the same processing is repeated in the next sequence.

Figure 4:
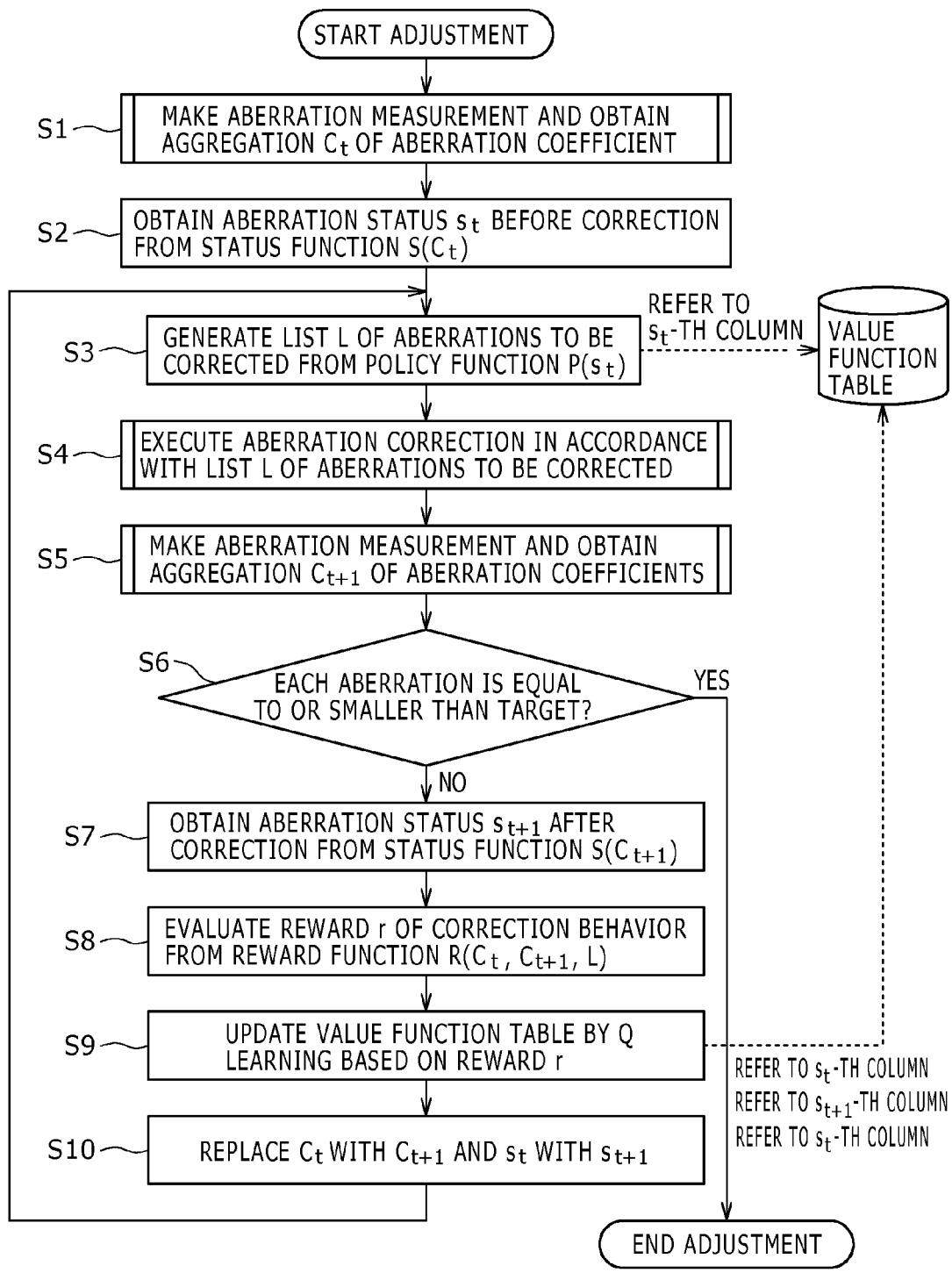
FIG. 4 is a flowchart of an automatic aberration correction process with a learning function according to the first embodiment.

Here, describing relation with FIG. 2, S2 and S3 of FIG. 4 are executed by the aberration correction selector 25 of FIG. 2, and S6 to S9 of FIG. 4 are executed by the aberration correction evaluator 26 of FIG. 2.

Hereinafter, the aforementioned status function, policy function, reward function, and Q learning will be described in detail.

FIG. 5 is a flowchart showing details of aberration status digitization procedures by the status function (S2 of FIG. 4). For the status function, where an aggregation $C_t=\{A_{1t}, B_{2t}, A_{2t}, C_{3t}, S_{3t}, A_{3t}\}$ of aberration coefficients outputted by the aberration measurement unit 18 is inputted, an absolute value of each aberration coefficient is taken (S2-1), and is then standardized with the correction target value (S2-2). The correction target value is calculated by, for example, Rayleigh quarter wavelength rules.

FIG. 6 show correction target values in a case where resolution 78 pm is targeted in an acceleration voltage of 200 kV and in a case where resolution 138 pm is targeted in an acceleration voltage of 80 kV.

Subsequently, for example, in accordance with judgment criteria shown in FIG. 7, the standardized values are subjected to 5-level evaluation and converted into numerical values of 0 to 4 (S2-3), and they are arrayed in order of A1, B2, A2, C3, S3 and A3 to provide a quinary number in six digits (S2-4). Finally, conversion from the quinary number into a decimal number is made (S2-5), thereby obtaining a numerical value $s_t$ in a decimal number indicating the aberration status.

Figures 7, 8:
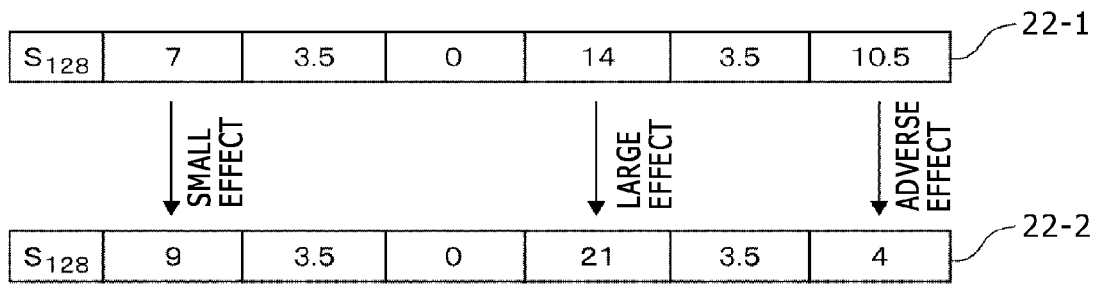
FIG. 7 is a diagram showing an example of determination criteria in the status function.
FIG. 8 is a diagram showing an example of an aberration status $s_{I\,28}$ of the value function table before update and after the update.

For example, assuming that the obtained numerical value $s_t$ in the decimal number is 128, the aberration status $s_{128}$ is indicated in a value function table 22-1 of FIG. 8.

Figure 9:
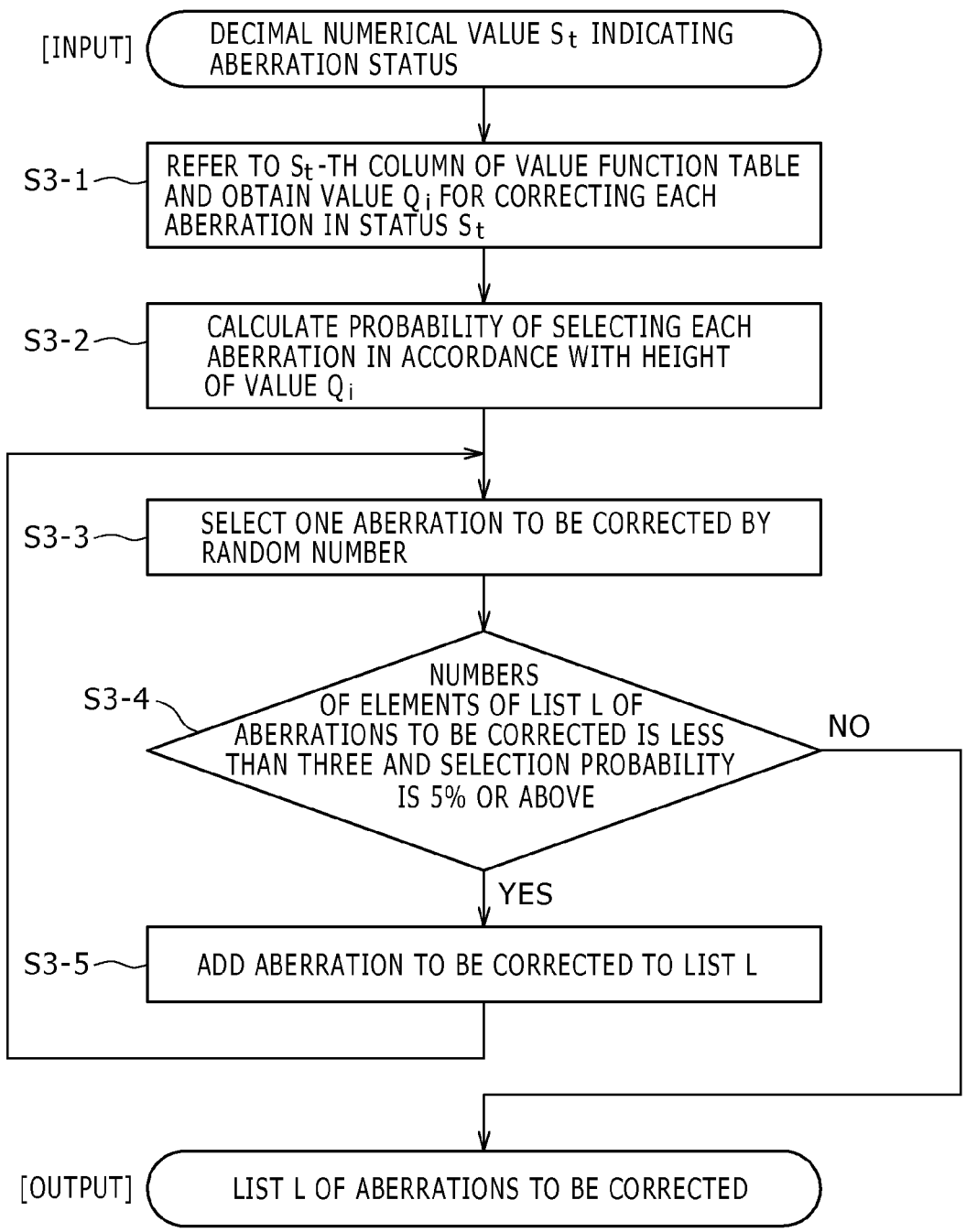
FIG. 9 is a flowchart showing procedures of selecting aberrations to be corrected by a policy function.

FIG. 9 is a flowchart showing details of procedures of selecting the aberrations to be corrected by the policy function (S3 of FIG. 4). For the policy function, where the status $s_t$ outputted by the status function is inputted, the $s_t$-th column of the value function table is referenced to thereby acquire values $Q_{A1}$, $Q_{B2}$, $Q_{A2}$, $Q_{C3}$, $Q_{S3}$, and $Q_{A3}$ for correcting A1, B2, A2, C3, S3, and A3 in the aberration status $s_t$ (S3-1). In the aberration status $s_{128}$ of the value function table 22-1 of FIG. 8, the values are A1=7, B2=3.5, A2=0, C3=14, S3=3.5, and A3=10.5. Then in accordance with heights of these values, a probability of selecting each aberration is calculated (S3-2). A possible method of calculating the selection probability is, for example, a method (Boltzmann method) of defining, as the selection probability $p_i$ of each aberration, Boltzmann distribution in formula (1) below where a height of the value is considered as energy.

[Formula 1]

$$p_i = \frac{\exp[Q_i/T]}{\sum_{j=\{A1,B2,A2,C3,S3,A3\}} \exp[Q_j/T]}, \quad (1)$$

$$i = A1, B2, A2, C3, S3, A3$$

Probability distribution is determined by a temperature parameter T (dimensionless quantity) of the Boltzmann distribution, and with larger T, even correction with the smaller value is easily selected. However, while increasing T results in attempts to perform correction for various aberration combinations, it delays convergence of the value function table. Stochastically selecting the aberration to be corrected is for the purpose of preventing the value function table from being stabilized with semi-optimum values (local minimum). When the selection probability of each aberration is obtained, one aberration to be corrected by a random number is selected (S3-3).

Figure 10:
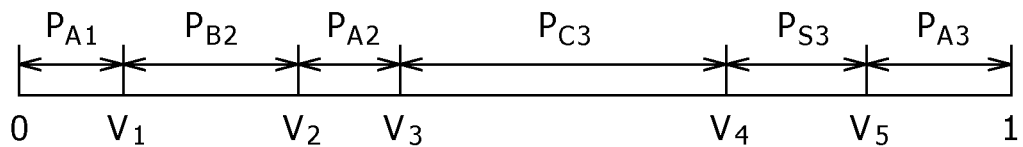
FIG. 10 is a diagram showing a concept of aberration selection by a random number.

FIG. 10 is a diagram showing a concept of the aberration selection by a random number. A sum of the selection probabilities is 1, and the selection probability of each aberration occupies a width in accordance with its value on a straight line of a value of 0 to 1. Here, a random number v is generated such that a real number of 0 or higher but less than 1 appears with the same probability, A1 is selected if $0 \le v < v_1$, B2 is selected if $v_1 \le v < v_2$, A2 is selected if $v_2 \le v < v_3$, C3 is selected if $v_3 \le v < v_4$, S3 is selected if $v_4 \le v < v_5$, and A3 is selected if $v_5 \le v < 1$. In case of FIG. 10, a probability of $v_3 \le v < v_4$ is highest, and thus C3 is likely to be selected. By repeating this aberration selection process by the random number (S3-3), the three aberrations at a maximum are selected. Note that, however, those with a selection probability of 5% or less are excluded (S3-4). By providing the selection probability with a lower limit and selecting a plurality of aberrations at a time in this manner, efficient correction with which a plurality of aberrations are corrected at a time is attempted, and those which were not effective as a result of learning are not selected. In this manner, for example, in the aberration status $s_{128}$ of the value function table 22-1 of FIG. 8, the three aberrations A1, C3, and S3 are selected. The aberrations to be corrected are added to the list L (S3-5), and this list L is passed over to the aberration correction unit 20 and the aberration correction is executed (S-4).

The aberration correction is performed by the feedback provision by the control unit 24 to the aberration corrector 6 and the objective lens 9 based on a control amount calculated by the aberration correction unit 20, but for the purpose of avoiding hunting (vertical fluctuation of the aberration coefficient with respect to the target value), the control amount (feedback amount) is multiplied by an attenuation coefficient K of 1 or below. Here, K is K=1.0−(relative measurement error) in view of a measurement error for each aberration coefficient. For example, if the relative measurement error is 20%, with K=0.8, 80% of the aberration coefficient is corrected. Determining the attenuation coefficient K in this manner makes it possible to adjust the feedback amount in accordance with a degree of reliability of the measurement value, and makes it possible to perform more efficient correction than that in a case where K is a fixed value. That is, since the relative measurement error is small when the aberration is large, increasing the feedback amount results in a decrease in the number of corrections, and since the relative measurement error is large when the aberration is small, a decreasing the feedback amount can prevent hunting.

Figure 11:
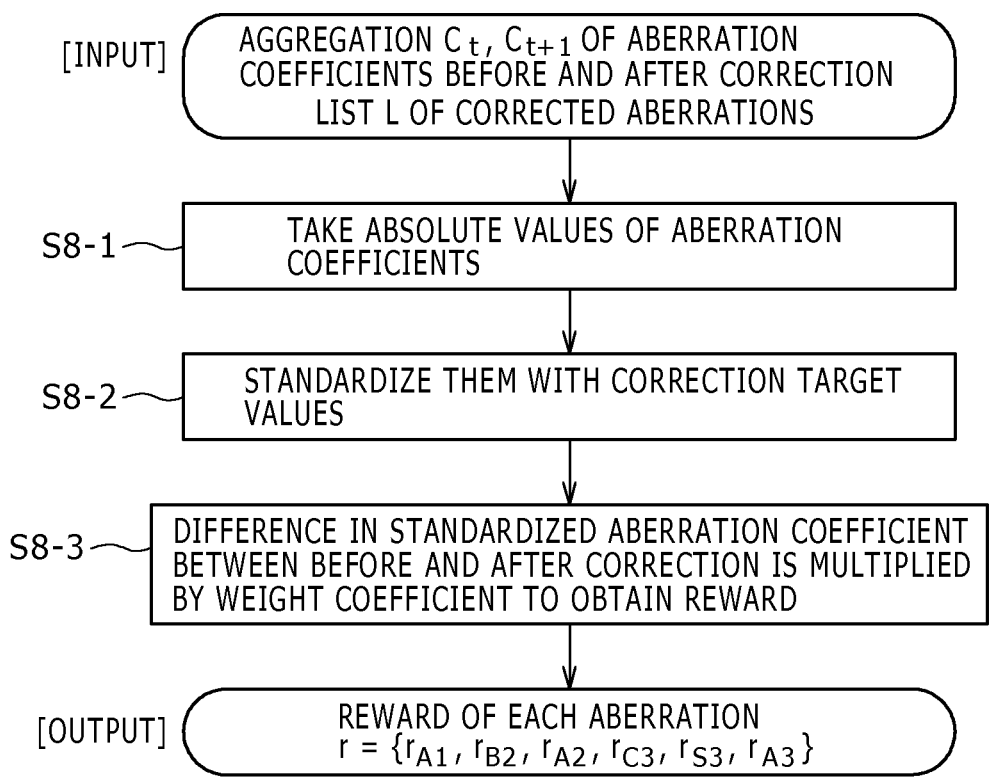
FIG. 11 is a flowchart showing procedures of evaluating correction results by a reward function.

FIG. 11 is a flowchart showing details of procedures (S8 of FIG. 4) of evaluating correction results by the reward function. For the reward function, an aggregation $C_t = \{A_{1t}, B_{2t}, A_{2t}, C_{3t}, S_{3t}, A_{3t}\}$, $C_{t+1} = \{A_{1t+1}, B_{2t+1}, A_{2t+1}, C_{3t+1}, S_{3t+1}, A_{3t+1}\}$ of the aberration coefficients before and after the aberration correction, and the list L of the (corrected) aberrations outputted by the policy function are inputted.

First, absolute values for respective elements $C_t$ and $C_{t+1}$ are taken (S8-1) and standardized with the correction target values (S8-2) to obtain standardized aberration coefficients before and after the correction, and then a difference between the standardized aberration coefficients before and after the correction (before the correction − after the correction) is multiplied by a weight coefficient W to provide a reward (S8-3). As a result, as the reward of each aberration, $r = \{r_{A1}, r_{B2}, r_{A2}, r_{C3}, r_{S3}, r_{A3}\}$ is outputted. The weight coefficient W is more increased for a smaller overall aberration after the correction. For example, assume that a sum of the values subjected to the 5-level evaluation in S2-3 of FIG. 5 is Σ, and W=1/Σ. The reward determined as described above is positive if the aberration has decreased as a result of the correction and is negative if the aberration has increased on the contrary, and the reward is larger with a larger difference and the reward is larger with a smaller overall aberration after the correction. Note that the reward of the non-corrected aberration (aberration whose element is not in the list L) is zero.

Figure 12:
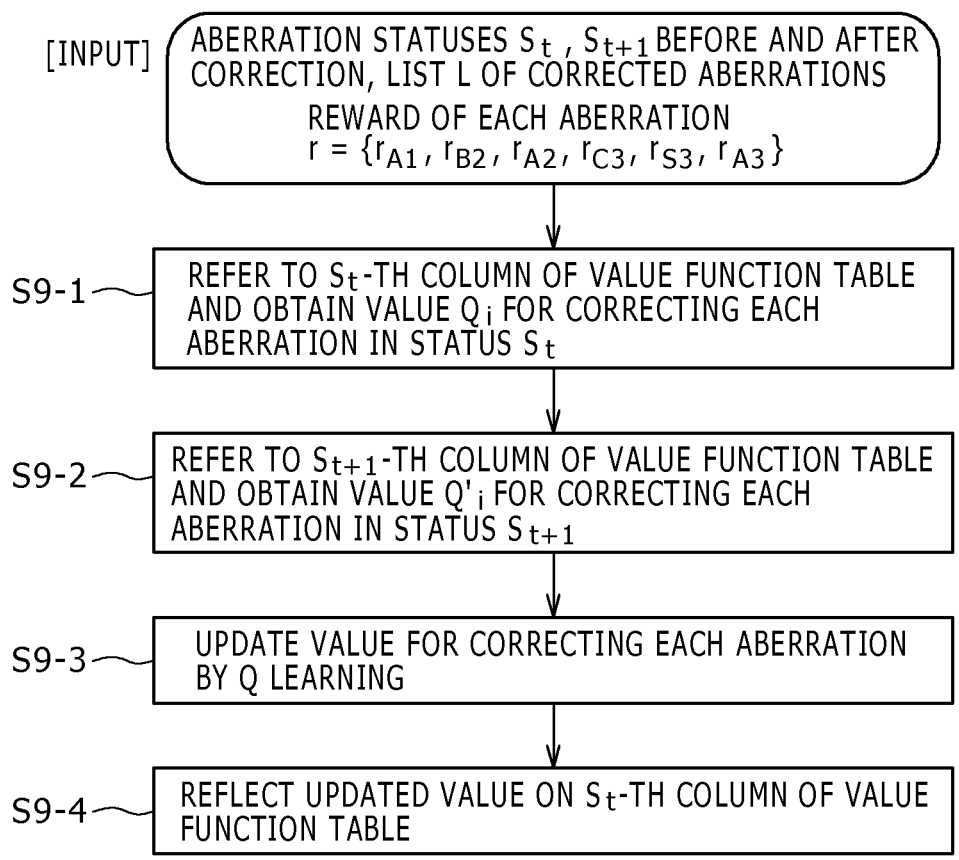
FIG. 12 is a flowchart showing procedures of updating the value function table by Q learning.

FIG. 12 is a flowchart showing details of procedures (S9 of FIG. 4) of updating the value function table 22 by Q learning. First, referring to the $s_t$-th and $s_{t+1}$-th columns of the value function table 22, values $Q_{A1}$, $Q_{B2}$, $Q_{A2}$, $Q_{C3}$, $Q_{S3}$, $Q_{A3}$ and $Q'_{A1}$, $Q'_{B2}$, $Q'_{A2}$, $Q'_{C3}$, $Q'_{S3}$, $Q'_{A3}$ for correcting A1, B2, A2, C3, S3, A3 in the aberration statuses $s_t$ and $s_{t+1}$ before and after the correction are obtained (S9-1, S9-2). For example, assume that the $s_t$-th column is $s_{128}$ (value function table 22-1 of FIG. 8) and the $s_{t+1}$-th column is $s_{345}$. Using these values and the reward ri of each aberration calculated by the reward function, the value for the corrected aberration is updated by learning (S9-3).

The Q learning is one of value update methods in reinforcement learning, and updates the values in accordance with formula (2) below.

[Formula 2]

$$Q_i \leftarrow Q_i + a\left\{r_i - Q_i + \gamma \max_{j=\{A1,B2,A2,C3,S3,A3\}} [Q'_j]\right\}, i \in L \quad (2)$$

Here, $\alpha$ is a learning rate ($0<\alpha\leq 1$) and $\gamma$ is a discount rate ($0\leq\gamma\leq 1$). Symbol $\alpha$ denotes which of the current value and the result obtained by action is weighed heavily. With $\alpha$ being closer to 1, the obtained result is weight more heavily, and a value change increases. On the contrary, as a result of approaching $\alpha$ closer to 0, the current value is weighed more heavily, and a value change decreases. On the other hand, $\gamma$ denotes which of the current reward and a future reward is weighed heavily. With $\gamma$ being closer to 0, the current reward is weighed more heavily, and with $\gamma$ being closer to 1, the future reward is weighed more heavily. In the invention, $\alpha=0.1$ and $\gamma=0.9$ which are standard values in the Q learning. The values in the aberration status $s_t$ updated by the Q learning are reflected on the $s_t$-th column of the value function table whereby learning results are recorded (S9-4).

For example, as learning results for the aberrations in the aberration status $s_{I\ 28}$ corrected based on the value function table 22-1 shown in FIG. 8, on an updated value function table 22-2, the value related to the greatly effective aberration coefficient C3 dramatically increases from 14 to 21, the value related to the less effective aberration coefficient A1 slightly increases from 7 to 9, and the value related to the adversely effective aberration coefficient A3 dramatically decreases from 10.5 to 4.

As described above, after end of an aberration correction sequence related to the aberration status $s_{128}$, the aberration status is replaced with $s_{t+1}$, $s_{345}$ in the above example (S10 of FIG. 4), then the process returns to the attempt phase (S3 of FIG. 4), and the same processing as that in case of the aberration status $s_{128}$ is repeated with a sequence related to the next aberration status $s_{345}$.

Through the automatic adjustment processes described above, learning of the value function table 22 proceeds in synchronization with the adjustment of the aberration corrector, and as the adjustment is repeated, more effective aberration correction can be selected.

In the charged particle beam devices with the same specifications, value function tables (master tables) with same initial values are normally set. According to this embodiment, updating, by learning, the master table reflecting an individual difference of each charged particle beam device results in a specific value function table which reflects the individual difference of each charged particle beam device and which gives optimum adjustment procedures.

Figure 13:
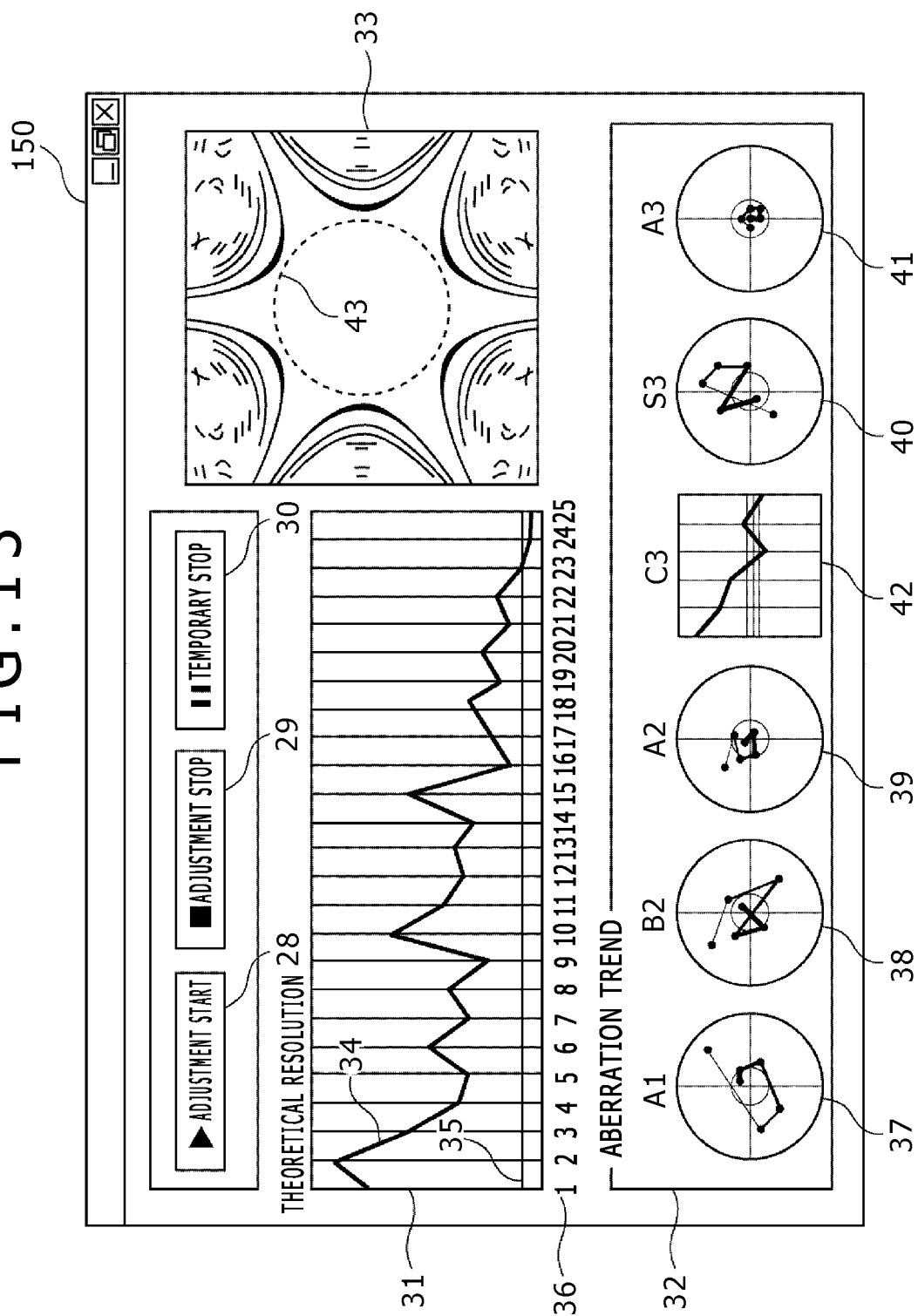
FIG. 13 is a diagram showing a screen of automatic aberration correction GUI according to the first embodiment.

FIG. 13 is a diagram showing one example of a screen 150 of automatic aberration correction GUI of the input and output unit 15. The screen 150 of the automatic aberration correction GUI is composed of: an adjustment start button 28 for starting adjustment; an adjustment stop button 29 for stopping adjustment; a temporary stop button 30 for temporarily stopping adjustment; a theoretical resolution graph display part 31 indicating an adjustment progress; an aberration trend display part 32 indicating a tendency of each aberration coefficient; a Ronchigram display part 33 obtained by the Ronchigram observation unit 16; and so on. On the theoretical resolution graph display part 31, where a sequence number 36 is plotted on a horizontal axis and resolution is plotted on a vertical axis, a theoretical resolution line 34 and a target resolution line 35 calculated from the aberration coefficient of each aberration are displayed, visualizing to what degree the correction has proceeded. Until the theoretical resolution line 34 becomes equal to or lower than the target resolution line 35, the aberration correction is repeatedly executed. The aberration tread display part 32 visualizes tendencies of a few times of correction in the past for each aberration coefficient. For the parasitic aberrations (A1, B2, A2, S3, A3) whose aberration coefficients are expressed by complex numbers, the aberration coefficients are plotted and linked together by lines on a complex plane (37 to 41), whereby not only magnitude of each aberration but also its direction are visualized, making it clear whether or not the correction of each aberration proceeds in a proper direction. At this point, colors of the lines linking together the plots are gradually lightened from the current one towards the past one, or thicknesses of the lines are gradually thinned, thereby making it easier to view correction processes even with the plots where the lines cross each other in a complex manner. Moreover, on the Ronchigram display part 33, finding whether or not a flat region where a contrast viewed at a center of the Ronchigram is uniform widens to a target flat region line 43 permits judgment on a degree of correction. By the user, in accordance with a progress condition of aberration correction and a status of the Ronchigram, the adjustment stop button 29 or the temporary stop button 30 of the GUI screen 150 is operated, and for a new GUI screen displayed accordingly, required operation can be performed.

Figure 14:
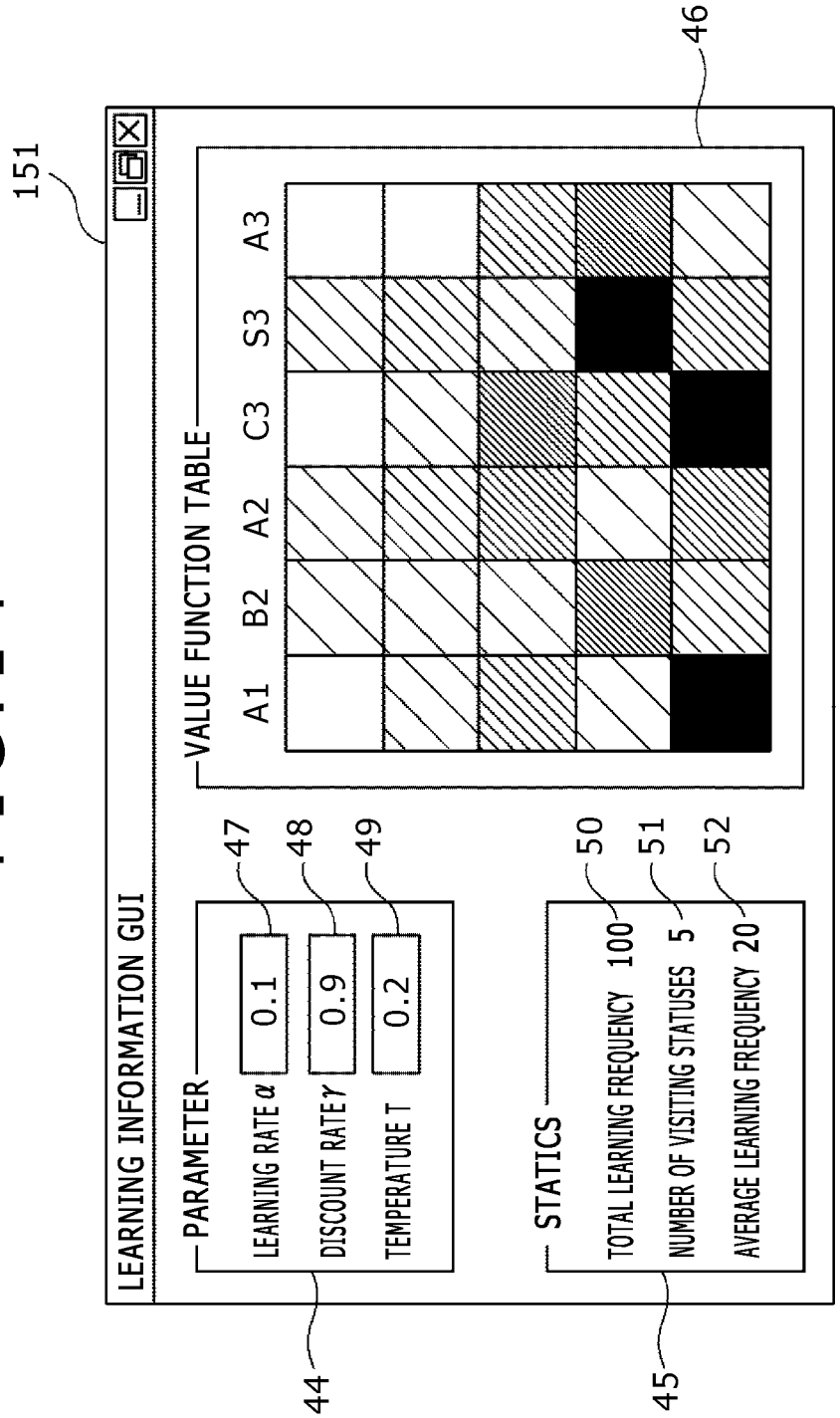
FIG. 14 is a diagram showing a screen of learning information GUI.

FIG. 14 is a diagram showing one example of a screen 151 of learning information GUI in an image display part of the input and output unit 15. The screen 151 of the learning information GUI is composed of: a parameter panel 44 setting learning parameters; a statistic panel 45 displaying statistical information of learning; and a value function table panel 46 visualizing the value function table. The parameter panel 44 is composed of: text boxes 47 and 48 for setting the learning rate $\alpha$ and the discount rate $\gamma$ in the Q learning described in the flowchart of FIG. 12; and a text box 49 for setting a temperature parameter T in a case where the Boltzmann method is adopted as the selection probability calculation method described in S3-2 of FIG. 9. The statistic panel 45 is composed of: a total learning frequency label 50 displaying total learning frequency; a visit status number label 51 displaying the number of visiting aberration statuses; and an average learning frequency label 52 displaying an average value of learning frequency obtained by dividing the total learning frequency by the number of visit statuses. On the value function table panel 46, for each aberration status $s_i$, magnitude of a value for the visiting aberration status is expressed in color gradation such as a gray scale. This permits the user to recognize to which degree the learning has proceeded.

According to this embodiment, a plurality of aberrations can be corrected at a time in accordance with the values of the value function table autonomously learned by the automatic aberration-correcting device. This embodiment is similarly applicable to aberration correction containing higher-level aberration.

According to this embodiment, acquiring, by the reinforcement learning, the optimum adjustment procedures with which a plurality of aberration correction can be simultaneously carried out makes it possible to perform automatic aberration correction reflecting the individual difference of the charged particle beam device in short adjustment time. Moreover, since the automatic aberration-correcting device autonomously acquires the optimum adjustment procedures through learning, even a user who is not skilled can perform appropriate aberration correction.

Second Embodiment

An example of a charged particle beam device according to the second embodiment of the invention will be described, with reference to FIG. 15.

In the invention, the value function table is updated based on the rewards calculated based on the aberration coefficients before and after the correction, and thus accuracy of aberration measurement is important. Thus, a possible method is recording a measurement history of aberration coefficients and not performing aberration correction when aberration measurement variance is equal to or larger than a specified value.

Figure 15:
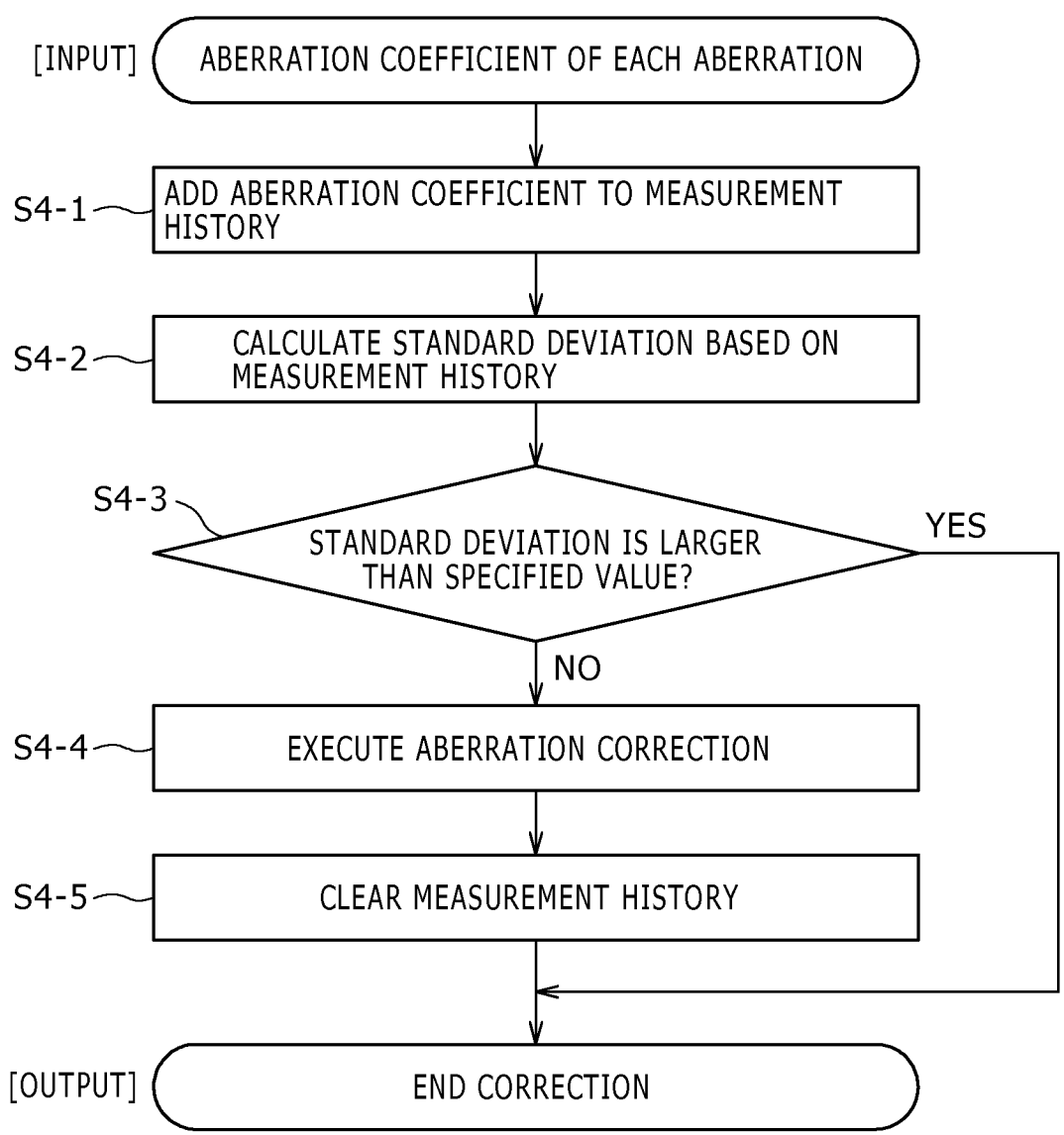
FIG. 15 is a flowchart showing procedures of aberration correction in view of aberration coefficient variation according to a second embodiment of the invention.

FIG. 15 is a flowchart showing aberration correction procedures in view of aberration coefficient measurement variance. Hereinafter, only a different point from the first embodiment will be mentioned. In the storage device 21, a measurement history table (not shown) recording the measurement history of aberration coefficients is saved. The aberration correction unit 20 adds each aberration coefficient outputted by the aberration measurement unit 18 to the measurement history table (S4-1), and calculates standard deviation based on data of the measurement history table (S4-2). If the standard deviation is larger than a specified value (S4-3), aberration correction is not performed, and if it is smaller, the aberration correction is executed (S4-4), and the measurement history table is cleared (S4-5). Note that for the measurement history and the standard deviation calculation, magnitude and a direction of the aberration coefficient may be separated from each other.

According to this embodiment, it is possible to perform automatic aberration correction in short adjustment time by acquiring, by reinforcement learning, optimum adjustment procedures with which a plurality of times of aberration correction can be simultaneously carried out based on highly accurate aberration measurement in view of the measurement history. Moreover, since the automatic aberration-correcting device autonomously acquires the optimum adjustment procedures by learning, a user of the charged particle beam device does not necessarily have to be a skilled adjustment staff member.

Third Embodiment

Figure 16:
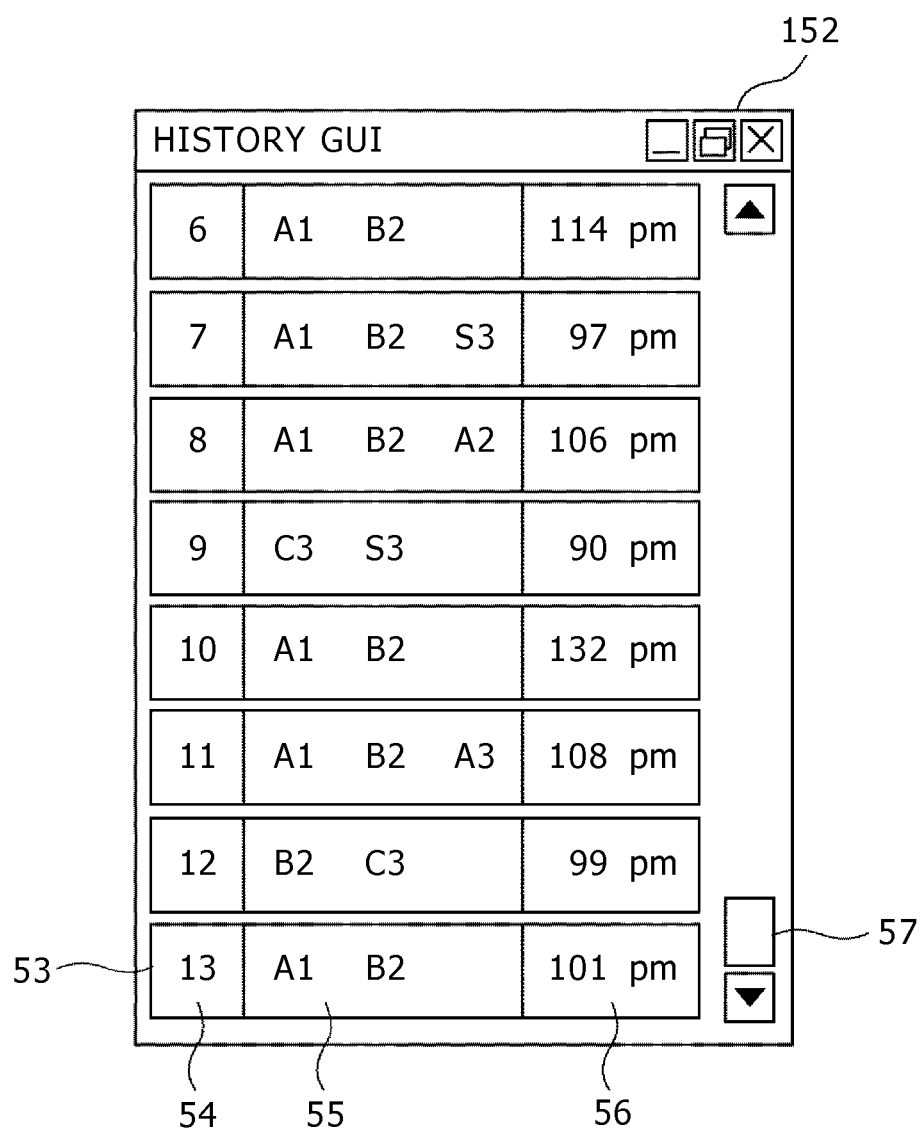
FIG. 16 is a diagram showing a screen of history GUI according to a third embodiment of the invention.

An example of a charged particle beam device according to a third embodiment of the invention will be described, with reference to FIGS. 16 and 17.

In a case where only a negative reward is obtained as a result of the aberration correction, a possible method is returning to a former status before the correction and redoing aberration correction selection. To return to the status before the correction, an undo function is required which records a history of control amounts of the control unit 24, that is, a history of correction and recovers to the recorded control amount when instructions to do so are given.

Hereinafter, only different points from the first embodiment will be mentioned. FIG. 16 is a diagram showing one example of a screen 152 of history GUI. FIG. 17 is a configuration diagram of the automatic aberration-correcting device 17 for realizing the undo function. The automatic aberration-correcting device 17 includes a control amount recording unit 27 recording the control amount of the control unit 24.

On the screen 152 of the history GUI, for a history item 53, a sequence number 54, corrected aberrations 55, and theoretical resolution 56 immediately before the correction are displayed. The sequence number 54 corresponds to the sequence number 36 of the screen 150 of the automatic aberration correction GUI of FIG. 13. In this example, the two or three aberrations are simultaneously corrected for each sequence and a value of the theoretical resolution 56 changes accordingly. Moreover, a value of the theoretical resolution 56 before correction of C3 and S3 performed with the sequence number 9 is most favorable.

Figure 17A:
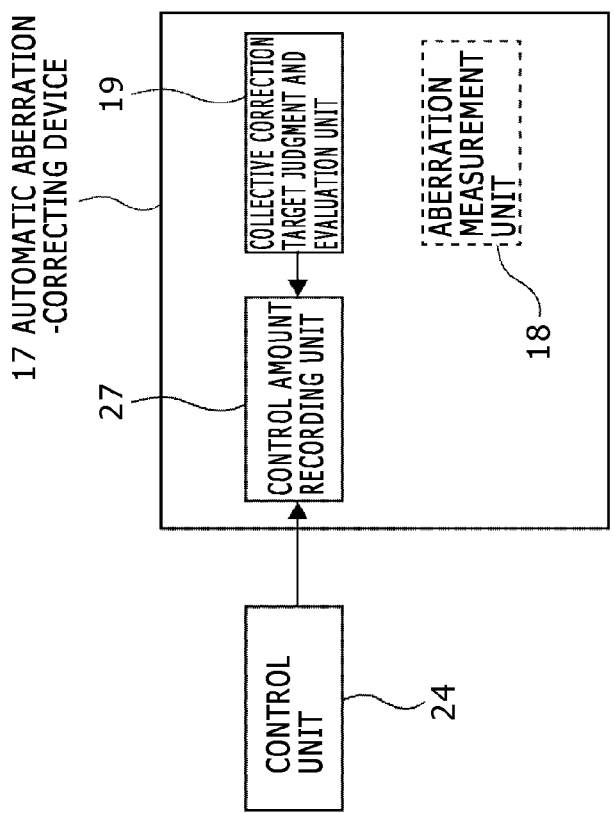
FIG. 17 is a configuration diagram for realizing a correction undo function according to the third embodiment.
Figure 17B:
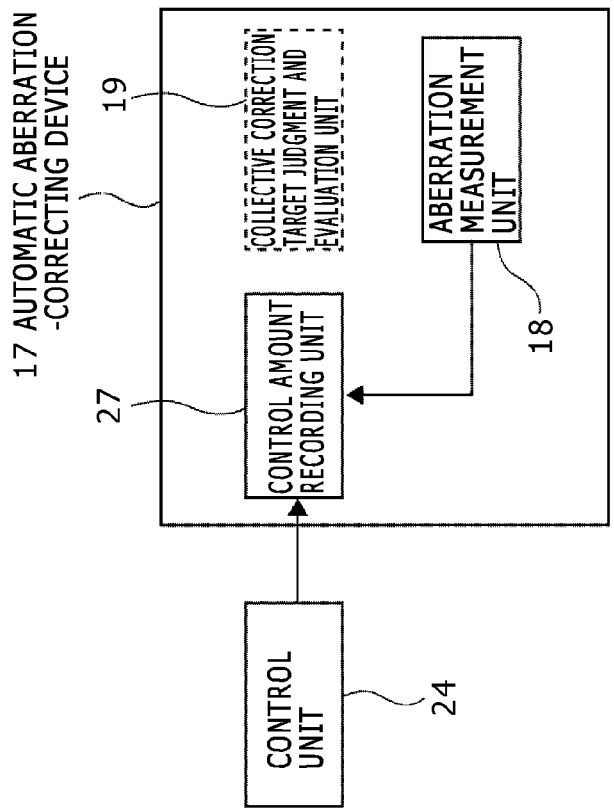

FIG. 17A corresponds to a recording phase, where instructions for recording the control amount of the control unit 24 upon performance of aberration measurement by the aberration measurement unit 18 (S-1, S-5 of FIG. 4) are given to the control amount recording unit 27. FIG. 17B corresponds to a recovery phase, where instructions for recovering to a value recording the control amount of the control unit 24 in a case where the rewards of the selected aberration corrections are all negative upon calculation of the reward of each aberration coefficient by the collective correction target judgment and evaluation unit 19 (S-8 of FIG. 4) are given to the control amount recording unit 27. In subsequently performed update of the value function table (S-9 of FIG. 4), the values of the selected aberration correction decrease (since the rewards were negative), and thus different aberration correction is more likely to be selected upon return to S-3 of FIG. 4 to make reselection of aberration correction.

Moreover, saving the control amounts recorded by the control amount recording unit 27 over the past (correction history) can realize a history function of recovering to the control amount in the status at a given time point. Moreover, it is also possible to write out the saved control amount in a file and read the written-out file for recovery.

As a result of double-clicking the history item of the screen 152 with a mouse, the control amount recording unit 27 recovers the control amount of the control unit 24 to a value at this time point to restore the status. For example, making selection by selecting the history item of the sequence number 9 of FIG. 16 restores a status with a theoretical resolution of 90 pm before the correction of C3 and S3 performed with the sequence number 9. Every time aberration correction is performed, the history item increases, and the latest history item is displayed at a lowest portion of the screen 152 of the history GUI, and thus those not displayed are referred to by use of a scroll bar 57.

The undo and history described above do not function completely when a status of an electromagnetic lens is largely changed to a degree such that hysteresis property becomes remarkable. However, the status of the electromagnetic lens is not largely changed at a time in normal adjustment processes, and thus undoing for returning to the immediately prior status functions without any problem. A degree of status restoring by the history function depends on how much of the past status is returned, but it practically raises little problem since an air core deflection coil, without hysteresis property is used for correction of the parasitic aberrations occupying a large portion of the adjustment processes in many cases.

According to this embodiment, it is possible to perform automatic aberration correction in short adjustment time by acquiring, by reinforcement learning, the optimum adjustment procedures with which a plurality of times of aberration correction can be simultaneously carried out. Moreover, since the automatic aberration-correcting device anonymously acquires the optimum adjustment procedures by learning, even a user who is not a skilled staff member can perform appropriate aberration correction.

Fourth Embodiment

An example of a charged particle beam device according to the fourth embodiment of the invention will be described, with reference to FIGS. 18A and 18B.

In the invention, an optimum value function table is optimized by anonymous leaning but the user (adjustment staff member) may teach values of the value function table in the adjustment processes depending on situation.

Figure 18A:
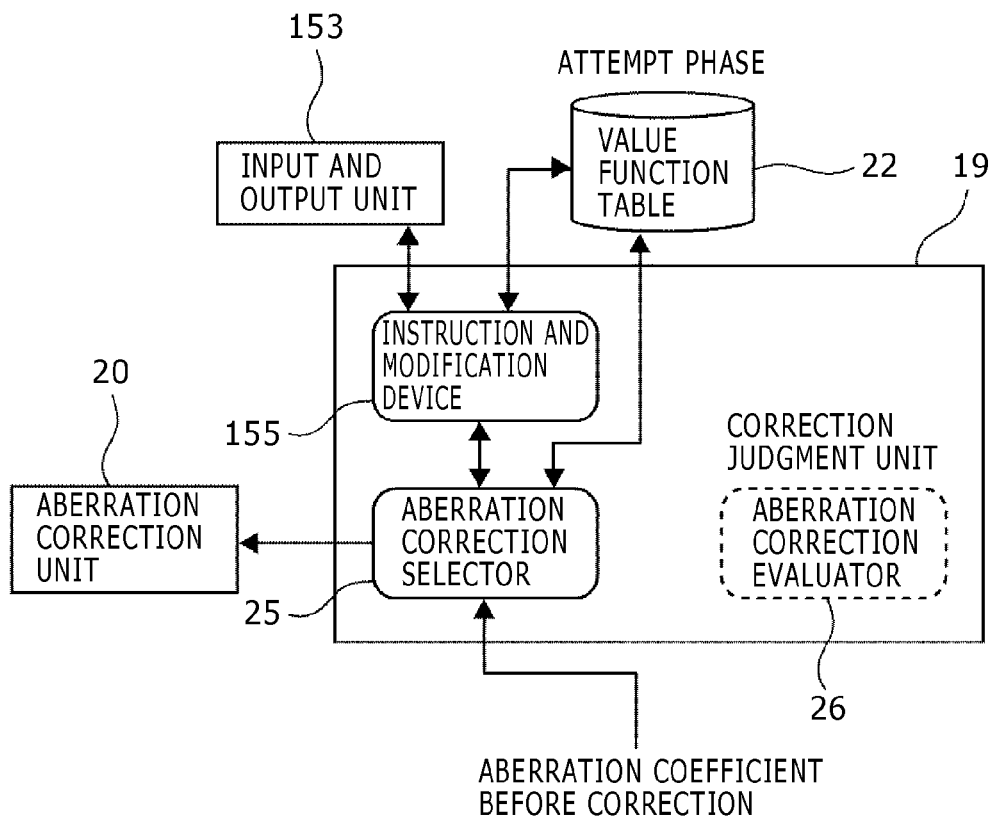
FIG. 18A is a diagram showing integration between a collective correction target judgment and evaluation unit and a value function table according to a fourth embodiment of the invention.

FIG. 18A shows interaction between the input and output unit 15 and the collective correction target judgment and evaluation unit 19 and the value function table 22 in an attempt phase before correction. Unlike the first embodiment, in the fourth embodiment, the collective correction target judgment and evaluation unit 19 includes a teaching and modification device 155. Moreover, the input and output unit 15 has a teach GUI function. In the attempt phase, based on each aberration coefficient before correction measured by the aberration measurement unit 18 and the value function table 22, the aberration correction selector 25 selects a plurality of aberrations to be collectively corrected and displays them on a screen 153 of the input and output unit 15. The user (adjustment staff member), when necessary, teaches values of the value function table with the teach GUI, and this result is inputted to the aberration correction selector 25 via the teaching and modification device 155. The collective correction target judgment and evaluation unit 19 gives instructions to the aberration correction unit 20 for collective correction based on the taught and modified data.

Figure 18B:
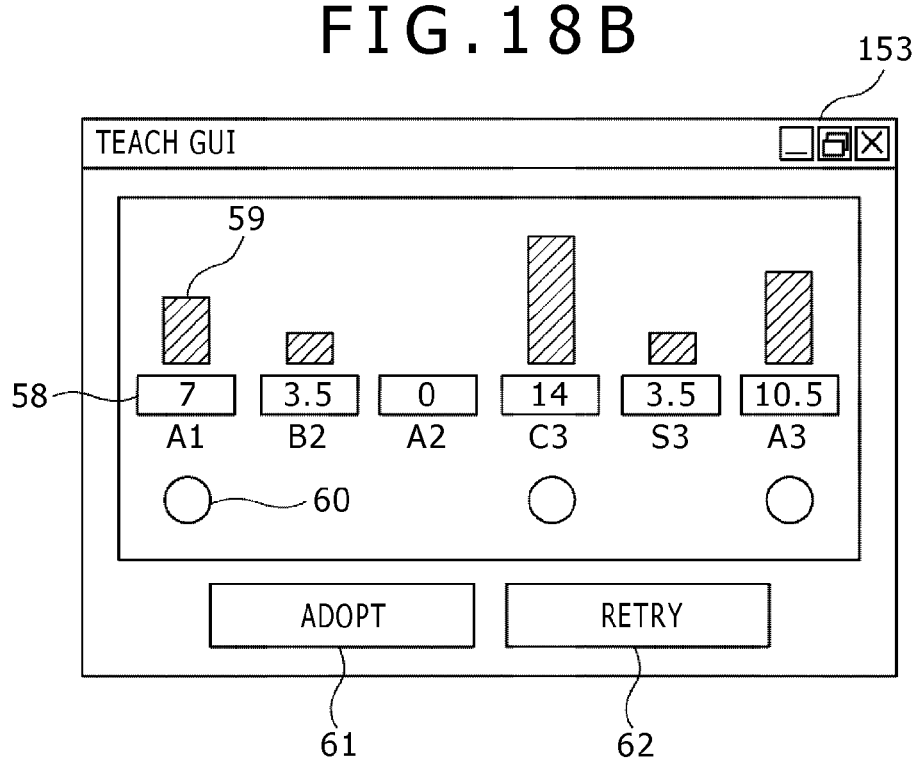
FIG. 18B is a diagram showing a screen of teach GUI according to the fourth embodiment.

FIG. 18B is a diagram showing one example of the screen 153 of the teach GUI. When the screen 153 of the teach GUI is displayed, until an adopt button 61 is pressed, correction in S4 of FIG. 4 is not performed. In a value text box 58 and a value bar 59, a value of the value Qi obtained in S3-1 of FIG. 9 is reflected, and for the aberrations selected in S3-2 of FIG. 9, a circle mark 60 is provided. If the selected aberrations are desired ones, the processing in S4 of FIG. 4 beyond is continued by pressing the adopt button 61 by the adjustment staff member. If the selected aberrations are not desired ones, the aberration to be corrected is selected again by the processes shown in S3-2 and S3-3 of FIG. 9 based on the modified values by substituting a desired value in the value text box 58 and pressing a retry button 62.

According to this embodiment, it is possible to perform automatic aberration correction in short adjustment time by acquiring, based on reinforcement learning and experiences of the user (adjustment staff member), optimum adjustment procedures with which a plurality of times of aberration correction can be simultaneously carried out.

The embodiments of the invention have been described above, referring to the scanning transmission electron microscope as an example. In the invention, there is no limitation on the aberration measurement method and correction method, and thus the invention is also applicable to other charged particle beam devices, for example, aberration correctors such as a transmission electron microscope, a scanning electron microscope, and a focused ion beam system.

As described above, according to the invention, it is possible to perform automatic aberration correction in short adjustment time by simultaneously carrying out a plurality of times of aberration correction which were effective in past adjustment.

DESCRIPTION OF REFERENCE NUMERALS

1 Electron beam source
2 Electron beam
3.4 Converging lens
5 Adjusting lens
6 Aberration corrector
7 Transfer lens
8 Scanner coil
9 Objective lens
10 Sample
11 Imaging lens
12 Dark-field image detector
13 Camera
14 Dark-field image observation unit
15 Input and output unit
16 Ronchigram observation unit
17 Automatic aberration corrector
18 Aberration measurement unit
19 Collective correction target judgment and evaluation unit
20 Aberration correction unit
21 Storage device
22 Value function table
23 Conversion coefficient table
24 Control unit
25 Aberration correction selector
26 Aberration correction evaluator
27 Control amount recording unit
28 Adjustment start button
29 Adjustment stop button
30 Temporary stop button
31 Theoretical resolution graph display part
32 Aberration trend display part
33 Ronchigram display part
34 Theoretical resolution line
35 Target resolution line
36 Sequence number
37 A1 trend
38 B2 trend
39 A2 trend
40 S3 trend
41 A3 trend
42 C3 trend
43 Target flat region line
44 Parameter panel
45 Statistic panel
46 Value function table panel
47 Learning rate α setting text box
48 Discount rate γ setting text box
49 Temperature parameter T setting text box
50 Total learning frequency label
51 Visit status number label
52 Average learning frequency label
53 History item
54 Sequence number (corresponding to sequence number 36)
55 Corrected aberration
56 Theoretical resolution
57 Scroll bar
58 Value text box
59 Value bar
60 Selected mark
61 Adopt button
62 Retry button 150 Screen of automatic aberration correction GUI
151 Screen of learning information GUI
152 Screen of history GUI
153 Screen of teach GUI

The invention claimed is:

1. A charged particle beam device comprising:
a charged particle beam source;
a charged particle optical system irradiating a sample with a charged particle emitted from the charged particle beam source as a charged particle beam;
an aberration corrector correcting a plurality of aberrations of the charged particle optical system including third or lower parasitic aberrations;
a control unit controlling various components of the charged particle optical system and the aberration corrector;
an aberration measurement unit measuring a plurality of aberration coefficients of the charged particle optical system;
a storage device saving a value function table holding a value indicating which of the plurality of measurement aberration coefficients is to be corrected preferentially;
the aberration corrector performing an aberration correction sequence based on the measured aberration coefficients and the value of the value function table
wherein learning of the value function table proceeds in synchronization with aberration adjustment, which is repeated until a more effective aberration correction is obtained.

2. The charged particle beam device according to claim 1, wherein the value function table classifies, into N-number of levels, a value obtained by standardizing each aberration coefficient with a respective correction target value thereof, provides, as an aberration status, a numerical value obtained by converting, into a decimal number, a N-base numerical value obtained by arraying the classified values, and provides the aberration status as a column index.

3. The charged particle beam device according to claim 2, wherein the value function table is set such that,
as an initial value, the relatively larger aberration has a higher value in the aberration status of a certain column, and
between different aberration statuses, the aberration status with a smaller sum of the aberration coefficients has a higher value.

4. The charged particle beam device according to claim 1, further comprising:
an aberration correction evaluator and a correction target judgment unit,
wherein the aberration correction evaluator of the correction target judgment unit judges to correct the plurality of aberrations in accordance with selection probability according to the value function table.

5. The charged particle beam device according to claim 1, further comprising:
a correction target judgment unit; and
an aberration correction evaluator,
wherein the aberration corrector collectively corrects the plurality of aberration judged by the correction target judgment unit to be collectively corrected,
wherein, as a reward, the aberration correction evaluator quantifies an effect of the collective aberration correction based on the aberration coefficients before and after the aberration correction measured, and updates the value of the value function table based on the reward,
wherein for the reward,
where a weight coefficient which is larger with a smaller overall aberration after correction is W, $$W \times ((\text{aberration coefficient before correction}) - (\text{aberration coefficient after correction})).$$

6. The charged particle beam device according to claim 1, wherein the aberration corrector makes conversion from the aberration coefficient of the aberration to be corrected into a correction control amount, by referring to a conversion coefficient table saved in the storage device, and corrects the aberration by multiplying the correction control amount by an attenuation coefficient K and providing a feedback to the control unit.

7. The charged particle beam device according to claim 1, further comprises:
a control amount recording unit recording a control amount of the control unit,
wherein the control amount recording unit records a control amount of the control unit before the aberration is corrected by the aberration correction unit, and returns to a status before the correction by recovering the recorded control amount by the control unit in a case where the rewards calculated by the correction target judgment unit are all negative.

8. The charged particle beam device according to claim 1, wherein the aberration corrector records, as a measurement history, the aberration coefficient measured by the aberration measurement unit,
calculates standard deviation of the aberration coefficient based on the measurement history, and
limits correction of the aberration until the standard deviation becomes equal to or smaller than a preset threshold value.

9. The charged particle beam device according to claim 1, further including an image display unit displaying a progress of the correction.

* * * * *